United States Patent [19]
Yoshimura et al.

[11] Patent Number: 6,160,434
[45] Date of Patent: Dec. 12, 2000

[54] NINETY-DEGREE PHASE SHIFTER

[75] Inventors: Tsutomu Yoshimura; Yasunobu Nakase; Yoshikazu Morooka; Naoya Watanabe, all of Tokyo, Japan

[73] Assignee: Mitsubishi Denki Kabushiki Kaisha, Tokyo, Japan

[21] Appl. No.: 09/177,379

[22] Filed: Oct. 23, 1998

[30] Foreign Application Priority Data

May 14, 1998 [JP] Japan .................................. 10-132115

[51] Int. Cl.⁷ ..................................................... H03K 5/13
[52] U.S. Cl. ........................................... 327/238; 327/254
[58] Field of Search ................................ 327/238, 3, 149, 327/154, 248, 236, 12, 244, 8, 161, 233, 235, 254, 255

[56] References Cited

U.S. PATENT DOCUMENTS

| | | | |
|---|---|---|---|
| 5,105,108 | 4/1992 | Ngo | 327/161 |
| 5,485,108 | 1/1996 | Kojima | 327/8 |
| 5,594,376 | 1/1997 | Aswell et al. | 327/236 |
| 5,654,674 | 8/1997 | Matsuno | 331/1 R |
| 5,684,421 | 11/1997 | Currin et al. | 327/261 |
| 5,815,016 | 9/1998 | Erickson | 327/158 |
| 5,945,849 | 8/1999 | Yamamoto | 327/12 |

OTHER PUBLICATIONS

K. Nakamura, et al., PLL Self–Timing Generator for Large–Scale High–Speed SRAMs, 1994 Spring Conference theses Collection, Conference on Electronic Data Communication, vol. 5, p. 256. (With English Abstract).

*Primary Examiner*—Tuan T. Lam
*Assistant Examiner*—Hiep Nguyen
*Attorney, Agent, or Firm*—Oblon, Spivak, McClelland, Maier & Neustadt, P.C.

[57] ABSTRACT

Transistors (MP1 and MP2) supply a current ($I_0$) for nodes (K and L), respectively. Transistors (MN10 and MN11) draw the same current from nodes (K and L), respectively. A parallel connection of serial connections (N1 and N2) draws a current ($I_1$) from the node (K) only when an exclusive OR of clocks (S1 and S2) is "H". On the other hand, a parallel connection of serial connections (N3 and N4) draws a current ($I_1$) from the node (L) only when the exclusive OR of clocks (S1 and S2) is "L". When the current ($I_1$) is drawn from the node (K), the current ($I_1$) flows out from the node (L) and when the current ($I_1$) is drawn from the node (L), the current ($I_1$) flows into the node (L). In the serial connections (N1 to N4), each of the clocks (S1 and S2) and their inverted signals (S1B and S2B) is applied to one of the gates of the transistors (MN1 to MN8) and therefore a uniform input load is obtained. With this configuration provided is a 90-degree phase shifter which achieves the uniform input load to improve a phase offset.

20 Claims, 11 Drawing Sheets

FIG. 13
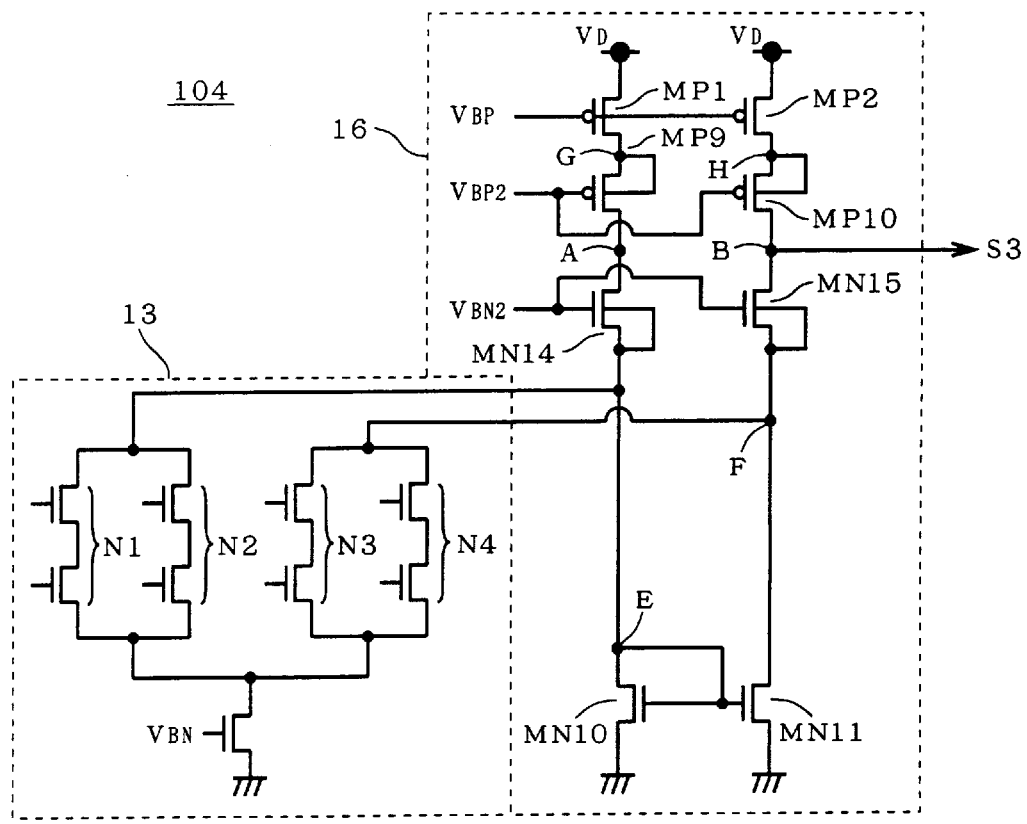
PRIOR ART  FIG. 14
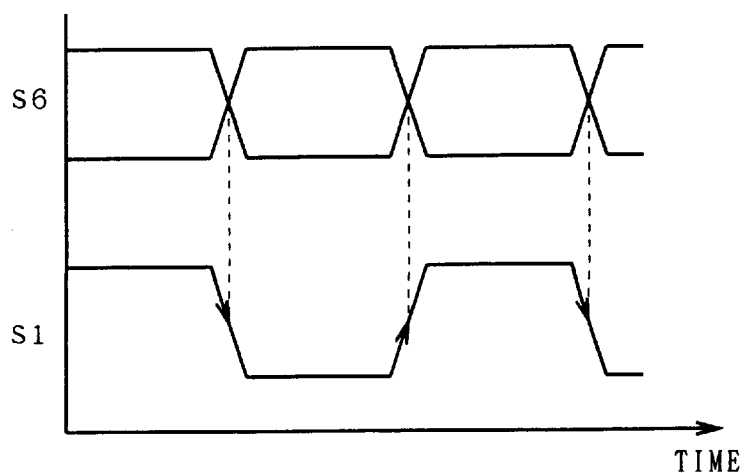

PRIOR ART FIG. 15
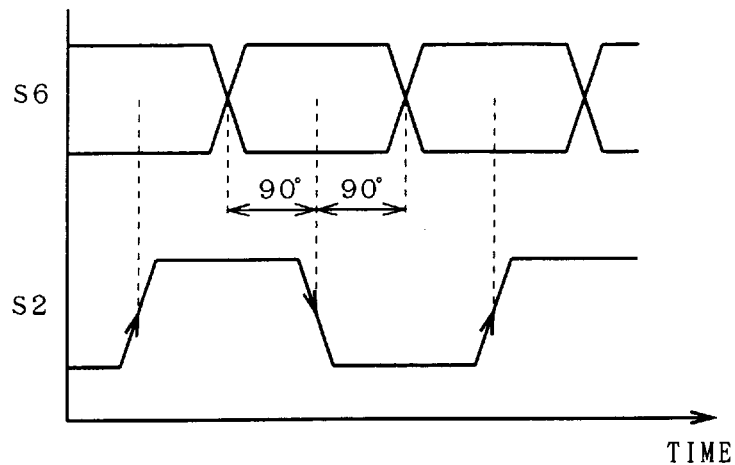
FIG. 16
BACKGROUND ART
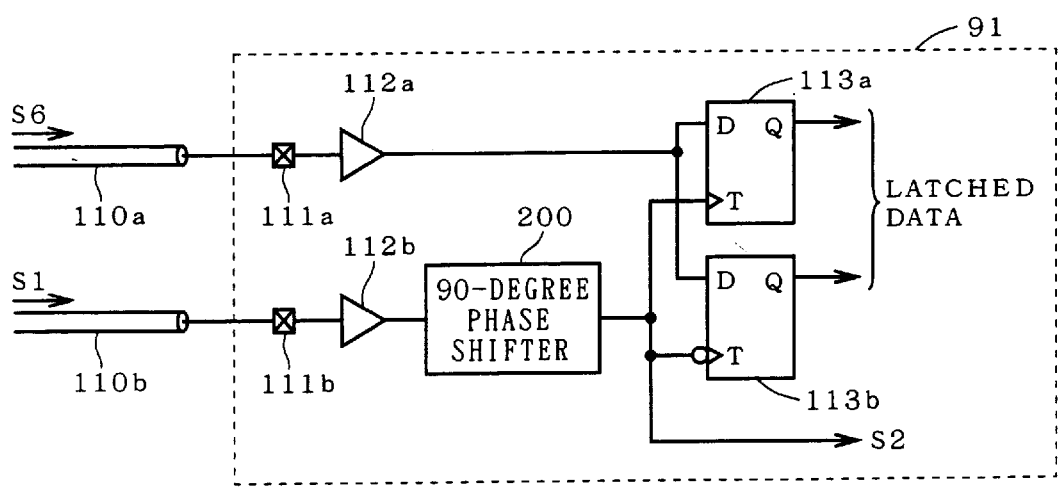

PRIOR ART  *FIG. 17*
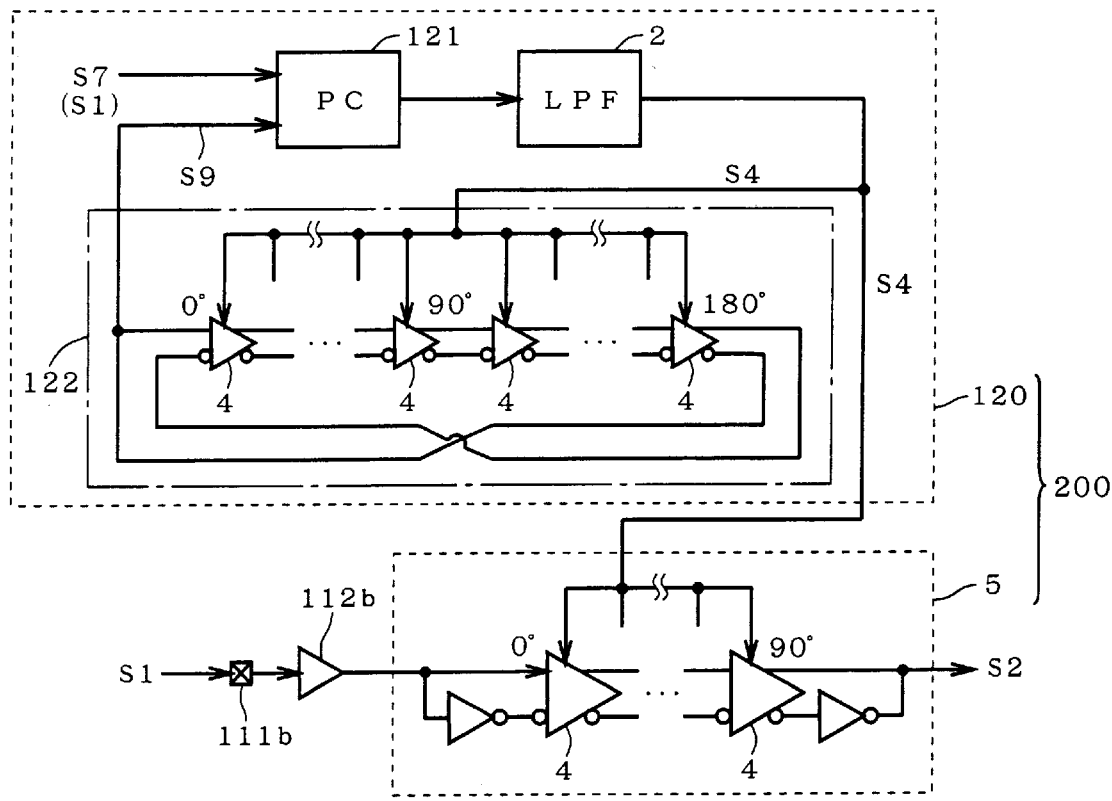
*FIG. 18*
BACKGROUND ART
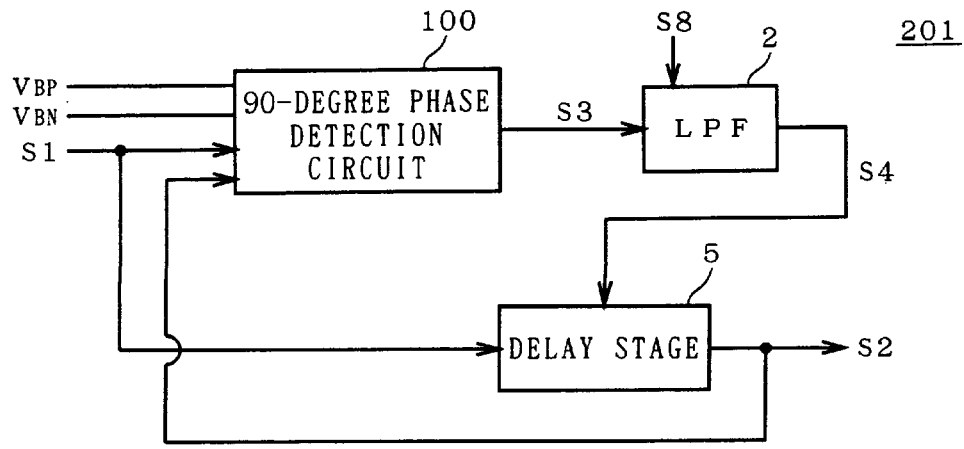

PRIOR ART FIG. 19
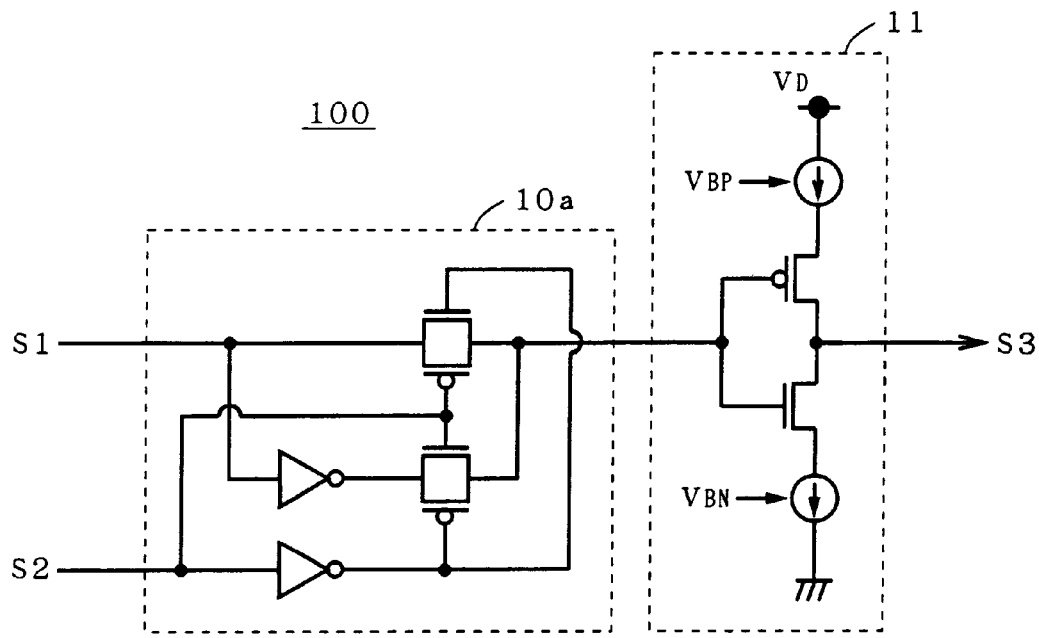
PRIOR ART FIG. 20
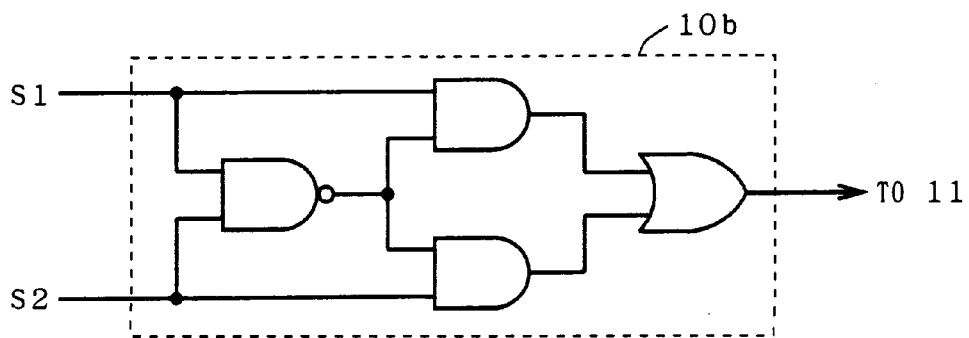

NINETY-DEGREE PHASE SHIFTER

BACKGROUND OF THE INVENTION

1. Field of the Invention

The present invention relates to a delay circuit for delaying an input signal by a quarter of a cycle, i.e., 90 degrees in phase, to output a delayed signal in a signal processing circuit, e.g., a receiving circuit for radio signals and a processing circuit of a computer (such a delay circuit is referred to as "90-degree phase shifter" in the present invention).

2. Description of the Background Art

FIG. 14 is a timing chart showing a relation between the data S6 and clock S1 which changes in the same cycle with the same phase as the data S6 does. In such a signal processing circuit which receives the data S6 and the clock S1, the data S6 can not be appropriately latched by using the change on rise or fall of the clock S1 since the data S6 changes as the clock S1 changes. For this reason, it is necessary to shift the clock S1 in phase relative to the data S6.

FIG. 15 is a timing chart after shifting the change of the clock S1 relative to that of the data S6 by 90 degrees in phase. By this, the rise or fall of the clock S1 comes at the center of an eye pattern of the data S6 (the halfway point of adjacent changes of the data 6), and therefore the data S6 can be most surely latched by using the change of the clock S1.

FIG. 16 is a circuit diagram showing an outline of an input interface of a chip 91 which receives the data S6 and the clock S1. The data S6 and the clock S1 are propagated through transmission lines 110a and 110b outside the chip 91 to pad electrodes 111a and 111b inside the chip 91 and buffered by buffers 112a and 112b, respectively. A phase shifter 200 thereafter shifts the clock S1 by 90 degrees, to generate a clock S2.

Latch circuits 113a and 113b each have a data input end D receiving the buffered data S6 and a clock input end T receiving the clock S2. The latch circuit 113a latches the data S6 on the rise of the clock S2 and the latch circuit 113b latches the data S6 on the fall of the clock S2.

FIG. 17 is a circuit diagram illustrating a configuration of the 90-degree phase shifter 200. The 90-degree phase shifter 200 comprises a PLL (Phase-Locked Loop) circuit 120 and a delay stage 5. The PLL circuit 120 comprises a VCO circuit 122, a phase comparator 121 and a low-pass filter 2. The PLL circuit 120 generates a signal S9 locked on a reference signal S7 in phase. At this time, the delay stage 5 uses a delay adjustment signal S4 given by the low-pass filter 2 for delay adjustment and delays the clock S1 buffered by the buffer 112b by 90 degrees to output the output clock S2.

In the 90-degree phase shifter 200, the number of buffers 4 in the VCO circuit 122 and the delay adjustment signal S4 from the low-pass filter 2 are determined so that a delay in the VCO circuit 122 may be a half of the cycle of the reference signal S7 (180 degrees in phase) when the PLL circuit 120 is locked. A pair of outputs from the last-stage buffer 4 are inverted in polarity and connected to a pair of inputs of the first-stage buffer 4. The VCO circuit 122 can thereby stably oscillate when given the reference signal S7 and obtains the signal S9 locked in the same cycle with the same phase as the reference signal S7.

Then, when the clock S1 is used as the reference signal S7 and the delay stage 5 is provided with buffers 4 half as much as the internal buffers 4 constituting the VCO circuit 122, the 90-degree phase shifter 200 can generate the signal S2 with its cycle shifted by a quarter relative to the clock S1. In other words, the delay stage 5 keeps a 90-degree delay in phase, not depending on the process or other conditions, so far as the PLL circuit 120 is locked.

The PLL circuit, however, has problems of instability and more volume of hardware and more power consumption due to necessity for the VCO circuit in general.

To solve the above problems suggested is a technique for shifting phase by 90 degrees without the PLL circuit 120. FIG. 18 is a circuit diagram illustrating a constitution of a 90-degree phase shifter 201 used instead of the 90-degree phase shifter 200 of FIG. 16. The 90-degree phase shifter 201 has a constitution where the VCO circuit 122 is omitted and the phase comparator 121 is replaced by a phase detection circuit 100 in the 90-degree phase shifter 200. In short, the 90-degree phase shifter 201 is a DLL (Delay-Locked Loop) circuit.

FIG. 19 is a circuit diagram illustrating a configuration of the 90-degree phase detection circuit 100. The 90-degree phase detection circuit 100 comprises an EXOR circuit 10a and a charging pump circuit 11. Exclusive OR of the clocks S1 and S2 obtained by the EXOR circuit 10a is converted into a UP/DOWN signal S3 in a form of current. To supply the UP/DOWN signal S3, the charging pump circuit 11 is provided with current sources whose current amounts depend on bias signals.

The UP/DOWN signal S3 is given to a low-pass filter 2 where its current amount is integrated and converted into a DC voltage signal as the delay adjustment signal S4 to be transferred to the delay stage 5. The delay adjustment signal S4 makes a feed-back to cause a delay for obtaining the clock S2 from the clock S1.

In the EXOR circuit 10a, however, the clock S1 is transferred to the charging pump circuit 11 through a transfer gate or a NOT circuit while the clock S2 is applied only to a gate for controlling ON/OFF of the transfer gate. Thus, the clocks S1 and S2 receive different input loads in the EXOR circuit 10a. Therefore, there arises a problem of phase shift of the clock S2, where the clock S2 is balanced being further shifted from the 90-degree-shifted phase relative to the clock S1 (this phase shift is referred to as "phase offset" hereinafter).

A suggestion to solve this problem is to use an EXOR circuit 10b having a configuration shown in FIG. 20 instead of the EXOR circuit 10a. Though this configuration gives the same input load to the clocks S1 and S2, it requires more transistors for a compound gate and therefore causes another problem of enlargement in circuit scale.

SUMMARY OF THE INVENTION

The present invention is directed to a 90-degree phase shifter. According to a first aspect of the present invention, the 90-degree phase shifter comprises: a first current control circuit having a first node and a second node, a first current source for supplying the first node with a first current, a second current source for supplying the second node with a first current, and a current mirror circuit including a first path for drawing a current from the first node and a second path for drawing a current from the second node; a second current control circuit having a first unit for drawing a second current from the first node only when an exclusive OR of first and second signals takes a first logic, and a second unit for drawing the second current from the second node only when the exclusive OR of the first and second signals takes a second logic different from the first logic; a first low-pass filter connected to the second node; and a delay unit for delaying the first signal by an amount of delay controlled by an output potential of the first low-pass filter to output the second signal.

According to a second aspect of the present invention, in the 90-degree phase shifter of the first aspect, the first low-pass filter comprises a resistor having a first end connected to the second node and a second end for obtaining the output potential of the first low-pass filter; a first capacitor having a first end connected to the first end of the resistor and a second end; and a second capacitor having a first end connected to the second end of the resistor and a second end connected to the second end of the first capacitor whose capacitance value is larger than that of the first capacitor.

According to a third aspect of the present invention, in the 90-degree phase shifter of the second aspect, the first low-pass filter further comprises a power supply mechanism for bringing the second capacitor into a charged condition as initial condition.

According to a fourth aspect of the present invention, the 90-degree phase shifter of the first aspect further comprises an offset cancel circuit, and in the 90-degree phase shifter of the fourth aspect, the offset cancel circuit has a differential amplifier including a positive input end receiving the output potential of the first low-pass filter as an input signal, a negative input end and an output end for outputting a control signal which controls the amount of delay together with the output potential of the first low-pass filter; and a dummy unit achieving a connection equivalent to the first current source and the first path of the current mirror circuit, being connected to the negative input end of the differential amplifier and including a dummy node corresponding to the first node.

According to a fifth aspect of the present invention, in the 90-degree phase shifter of the fourth aspect, the offset cancel circuit further has a second low-pass filter provided between the first low-pass filter and the positive input end of the differential amplifier and having a time constant larger than that of the first low-pass filter.

According to a sixth aspect of the present invention, in the 90-degree phase shifter of the first aspect, the first current source comprises a first transistor having a source and a back-gate which are connected in common to the first node, a gate to which a first bias is applied and a drain; and a second transistor having a drain connected to the drain of the first transistor, a gate to which a second bias is applied and a source, and the second current source comprises a first transistor having a source and a back-gate which are connected in common to the second node, a gate to which the first bias is applied and a drain; and a second transistor having a source connected to the source of the second transistor of the first current source, a drain connected to the drain of the first transistor of the second current source and a gate to which the second bias is applied.

According to a seventh aspect of the present invention, in the 90-degree phase shifter of the sixth aspect, the first current source further comprises a third transistor having a drain connected to the drain of the first transistor of the first current source, a source and a back-gate connected in common to the drain of the second transistor of the first current source and a gate to which a third bias is applied, and the second current source further comprises a third transistor having a drain connected to the drain of the first transistor of the second current source, a source and a back-gate connected in common to the drain of the second transistor of the second current source and a gate to which a third bias is applied.

According to an eighth aspect of the present invention, the 90-degree phase shifter comprises: a first current source; a second current source; an output node; a first switch provided between the first current source and the output node, which becomes conducting only when an exclusive OR of first and second signals takes a first logic; a second switch provided between the second current source and the output node, which becomes conducting only when the exclusive OR of the first and second signals takes a second logic different from the first logic; a low-pass filter connected to the output node; and a delay unit for delaying the first signal by an amount of delay controlled by an output potential of the low-pass filter to output a second signal, the first switch having first and second serial connections connected in parallel to each other between the first current source and the output node, the second switch having first and second serial connections connected in parallel to each other between the second current source and the output node, the first serial connection of the first switch consisting of a first transistor which becomes conducting when the first signal takes the first logic and a second transistor which becomes conducting when the second signal takes the second logic, the second serial connection of the first switch consisting of a first transistor which becomes conducting when the first signal takes the second logic and a second transistor which becomes conducting when the second signal takes the first logic, the first serial connection of the second switch consisting of a first transistor which becomes conducting when the first signal takes the first logic and a second transistor which becomes conducting when the second signal takes the first logic, and the second serial connection of the second switch consisting of a first transistor which becomes conducting when the first signal takes the second logic and a second transistor which becomes conducting when the second signal takes the second logic.

In the 90-degree phase shifter of the first aspect, since the second current is drawn out from the first node by the first unit at the point in time when the first and second signals take different logics, the second path of the current mirror circuit carries a current which is smaller than the first current by the second current. On the other hand, since the second current source supplies the second node with the first current, the second current flows out from the second node to the first low-pass filter. Conversely, at the point in time when the first and second signals take the same logic, the second current is drawn out from the second node by the second unit. Since no current is drawn out from the first node, however, the second path of the current mirror circuit carries the first current. Therefore, the second current flows into the second node from the first low-pass filter. The current flow is integrated in the first low-pass filter to control the amount of delay of the delay unit. The delay unit delays the first signal with this amount of delay to generate the second signal, thus controlling a feed-back so that the first and second signals may be locked keeping 90-degree phase difference.

In the 90-degree phase shifter of the second aspect, the jitter of the second current flowing in/out to/from the first low-pass filter from/to the second node is suppressed by the time constant which depends on the first capacitor and the resistor.

In the 90-degree phase shifter of the third aspect, by setting the output potential of the first low-pass filter at large value in its initial state, it is possible to perform a shift to the locked condition with a small delay value for obtaining the second signal.

In the 90-degree phase shifter of the fourth aspect, it is possible to monitor the values of the first and second nodes by using the dummy unit and the first low-pass filter. Therefore, even if there is a potential difference between the first and second nodes in the balanced condition, the control signal controls the amount of delay to suppress the potential difference.

In the 90-degree phase shifter of the fifth aspect, after the delay has been once controlled, the differential amplifier slowly controls the resistance value of the variable resistor to suppress the phase shift while almost keeping the balanced condition.

In the 90-degree phase shifter of the sixth aspect, since the first transistor of the first current source and the first transistor of the second current source diminish the potential difference between the first and second nodes, it is possible to ensure the operation of the current mirror circuit and suppress the phase offset.

In the 90-degree phase shifter of the seventh aspect, the third transistor of the first current source and the third transistor of the second current source further ensure the operation of the current mirror circuit and further suppress the phase offset.

In the 90-degree phase shifter of the eighth aspect, the first switch decides whether to connect the first current source to the output node based on the first and second signals. And the first and second signals have the same load for the first switch. Further, the second switch decides whether to connect the second current source to the output node based on the first and second signals. And the first and second signals have the same load for the second switch. Therefore, it is possible to suppress the phase offset with uniform load of the first and second signals.

An object of the present invention is to provide a 90-degree phase shifter with simple circuit configuration. Another object is to provide a phase shifter which gives the same load to two signals to be phase-locked. Still another object is to improve a phase offset.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a circuit diagram showing a configuration in accordance with a fifth preferred embodiment of the present invention;

FIGS. 14 and 15 are timing charts showing the prior art; and

FIGS. 16 to 20 are circuit diagrams showing the prior art.

DESCRIPTION OF THE PREFERRED EMBODIMENTS

The First Preferred Embodiment

Figure 1:
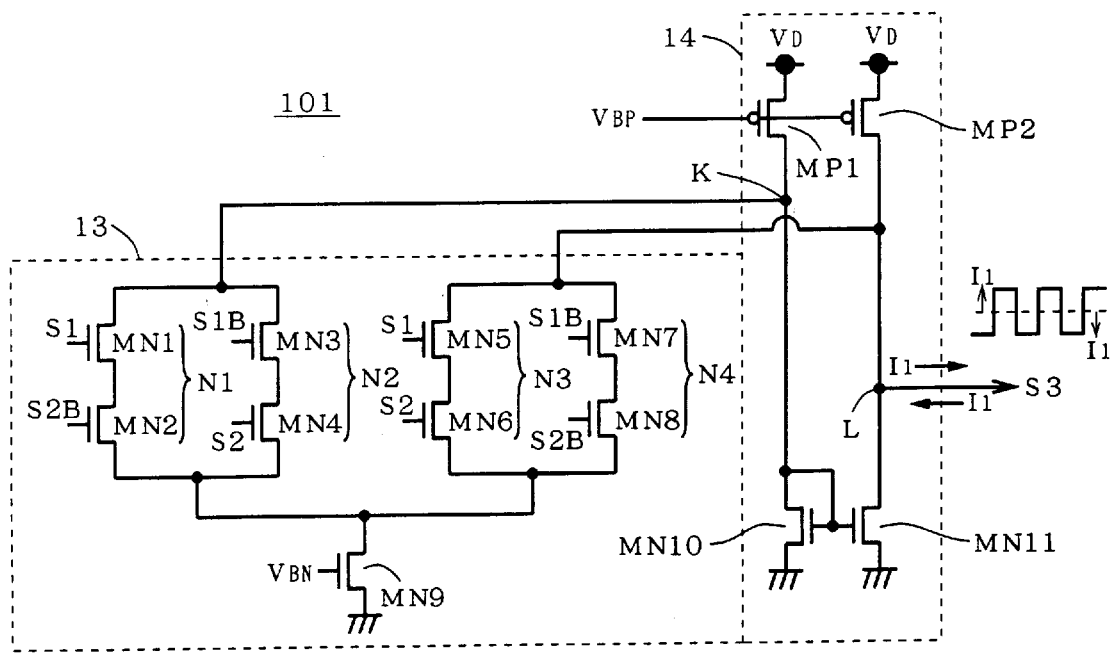
FIG. 1 is a circuit diagram showing a configuration in accordance with a first preferred embodiment of the present invention.

FIG. 1 is a circuit diagram showing a configuration of a 90-degree phase detection circuit 101 which is used instead of the 90-degree phase detection circuit 100 of FIG. 18 in a 90-degree phase shifter in accordance with the first preferred embodiment of the present invention.

The 90-degree phase detection circuit 101 comprises an EXOR unit 13 and a current control unit 14. The EXOR unit 13 consists of Nch transistors MN1 to MN8 having the same characteristics and an Nch transistor MN9. The current control unit 14 consists of Pch transistors MP1 and MP2 having the same characteristics and Nch transistors MN10 and MN11 having the same characteristics.

In the EXOR unit 13, the drains of the transistors MN1 and MN3 are connected to each other and the drains of the transistors MN5 and MN7 are connected to each other. The source of the transistor MN1 and the drain of the transistor MN2 are connected to each other and the source of the transistor MN3 and the drain of the transistor MN4 are connected to each other. The source of the transistor MN5 and the drain of the transistor MN6 are connected to each other and the source of the transistor MN7 and the drain of the transistor MN8 are connected to each other. The sources of the transistors MN2, MN4, MN6 and MN5 are connected in common. The clock S1 is applied to the gates of the transistors MN1 and MN5 and its inverted signal S1B is applied to the gates of transistors MN3 and MN7. The clock S2 is applied to the gates of the transistors MN4 and MN6 and its inverted signal S2B is applied to the gates of transistors MN2 and MN8. The drain of the transistor MN9 is connected in common to the sources of the transistors MN2, MN4, MN6 and MN8 and the source of the transistor MN9 is grounded. The gate of the transistor MN9 is supplied with a bias potential $V_{BN}$.

In the current control unit 14, the sources of the transistors MP1 and MP2 are supplied in common with a power-supply potential $V_D$ and the gates thereof are supplied with a bias potential $V_{BP}$. The sources of the transistors MN10 and MN11 are both grounded. The drain of the transistor MP1 is connected to the drain and gate of the transistor MN10 and also connected to the drains of the transistors MN1 and MN3 at a node K. The drain of the transistor MP2 is connected to the drain of the transistor MN11 and also connected to the drains of the transistors MN5 and MN7 at a node L. The UP/DOWN signal S3 is obtained in a form of current which flows into or out from the node L.

In the EXOR unit 13, when the clocks S1 and S2 take the same logic value, either one of the transistors MN1 and MN2 constituting a serial connection N1 turns off. In the same manner, either one of the transistors MN3 and MN4 constituting a serial connection N2 turns off. Therefore, a branch in which the serial connections N1 and N2 are connected in parallel is in an off state on the whole. On the other hand, when the clocks S1 and S2 are in a HIGH level, both the transistors MN5 and MN6 constituting a serial connection N3 turn on. When the clocks S1 and S2 are in a LOW level, both the transistors MN7 and MN8 constituting a serial connection N4 turn on. Therefore, a branch in which the serial connections N3 and N4 are connected in parallel is in an on state on the whole.

When the clocks S1 and S2 take different logic values, either one transistor turns off in each of the serial connections N3 and N4 and the branch in which the serial connections N3 and N4 are connected in parallel is in the off state on the whole. On the other hand, either one of the serial connections N1 and N2 turns on.

Thus, the parallel connection of the serial connections N1 and N2 becomes conducting only when the exclusive OR of the clocks S1 and S2 is "H" and the parallel connection of the serial connections N3 and N4 becomes conducting only when the exclusive OR of the clocks S1 and S2 is "L".

Figure 2:
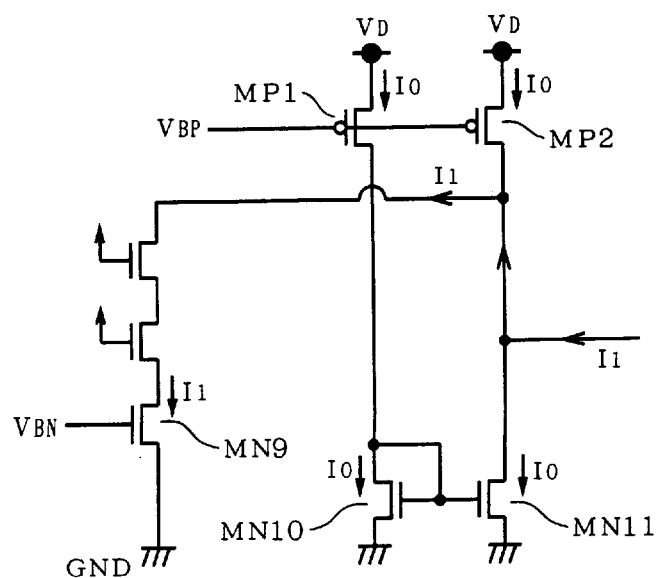
FIGS. 2 and 3 are circuit diagrams showing an operation in accordance with the first preferred embodiment of the present invention.

FIG. 2 is a circuit diagram showing an equivalent circuit of the 90-degree phase detection circuit 101 when the clocks S1 and S2 take the same logic value. In this figure, gates with an upward-pointing arrow is supplied with logic "H" (the same applies to the following figures). Since the gates of the transistors MP1 and MP2 are each supplied with the bias potential $V_{BP}$ and the drains thereof are each supplied with the power-supply potential $V_D$, the source-gate voltage across the transistor MP1 and that across the transistor MP2 are equal. Therefore, the transistors MP1 and MP2 each produce a current $I_0$.

Since the transistors MN10 and MN11 constitute a current mirror circuit and the branch in which the serial connections N1 and N2 are connected in parallel is in the off state on the whole, a current equivalent to the current $I_0$, which the transistor MP1 produces flows in each of the transistors MN10 and MN11. On the other hand, since the transistor MN9 produces a current $I_1$ based on the bias potential $V_{BN}$, the current $I_1$ is drawn as the UP/DOWN signal S3 through a path connected to the low-pass filter 2 into the current control unit 14. Hereinafter, a period while the current $I_1$ is drawn into the current control unit 14 is referred to as "down period".

Figure 3:
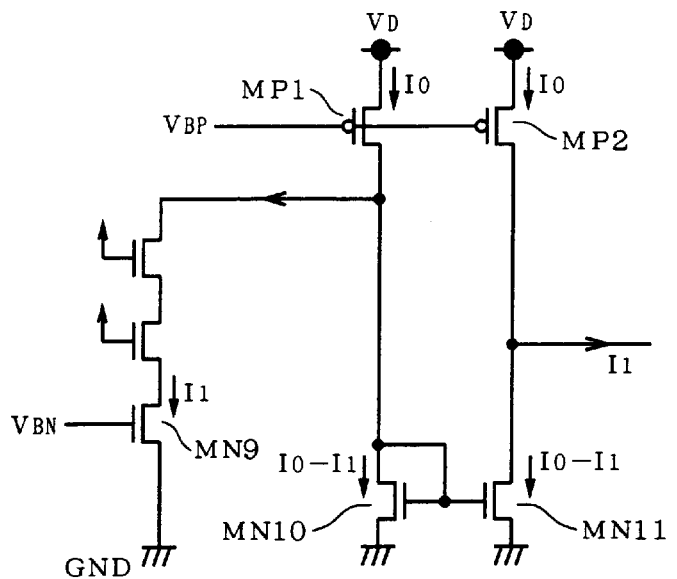

FIG. 3 is a circuit diagram showing an equivalent circuit of the 90-degree phase detection circuit 101 when the clocks S1 and S2 take different logic values. Since there is a path from the drain side of the transistor MN10 towards the transistor MN9 and the transistor MP1 produces the current $I_0$ and the transistor MN9 produces the current $I_1$, a current $(I_0–I_1)$ flows in each of the transistors MN10 and MN11. Since the transistor MP2 produces the current $I_0$, the current $I_1$ flows out as the UP/DOWN signal S3 from the current control unit 14 to the low-pass filter 2. Hereinafter, a period while the current $I_1$ flows out to the low-pass filter 2 is referred to as "up period".

Figure 4:
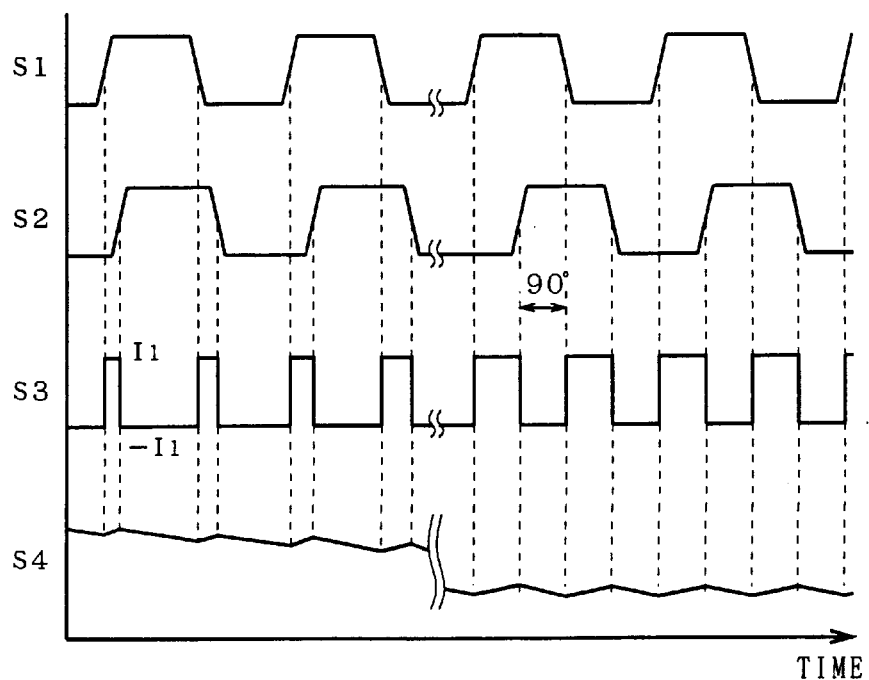
FIG. 4 is a timing chart showing the operation in accordance with the first preferred embodiment of the present invention.

FIG. 4 is a timing chart showing a comparison between the UP/DOWN signal S3 generated as above and the clocks S1 and S2 and further showing the delay adjustment signal S4, where a direction of the current as the UP/DOWN signal S3 flowing out from the current control unit 14 to the low-pass filter 2 is positive and that flowing into the current control unit 14 from the low-pass filter 2 is negative. Since the 90-degree phase detection circuit 101 of the first preferred embodiment can be used instead of the 90-degree phase detection circuit 100 of FIG. 18, the following discussion will be made with reference also to FIG. 18.

When the control over the phase starts with a delay value of the delay stage 5 which is less than 90 degrees, the UP/DOWN signal S3 from the 90-degree phase detection circuit 101 during the down period is longer than that during the up period. Therefore, the delay adjustment signal S4 which is a DC voltage obtained by integrating the UP/DOWN signal S3 in the low-pass filter 2 falls on the average though during the up period there are a slight number of exceptions. The delay value of the delay stage 5 thereby increases and when it comes to a quarter of the cycle, the up period and the down period of the UP/DOWN signal S3 in the 90-degree phase detection circuit 101 become equal. In other words, the phase of the clock S2 lags behind that of the clock S1 by 90 degrees, being balanced.

When the control over the phase starts with the delay value of the delay stage 5 which is more than 90 degrees, the UP/DOWN signal S3 during the up period is longer than that during the down period. Therefore, though during the down period there are a slight number of exceptions, the delay adjustment signal S4 rises on the average and the delay value thereby decreases. Like the former case, the phase of the clock S2 lags behind that of the clock S1 by 90 degrees, being balanced.

Figure 5:
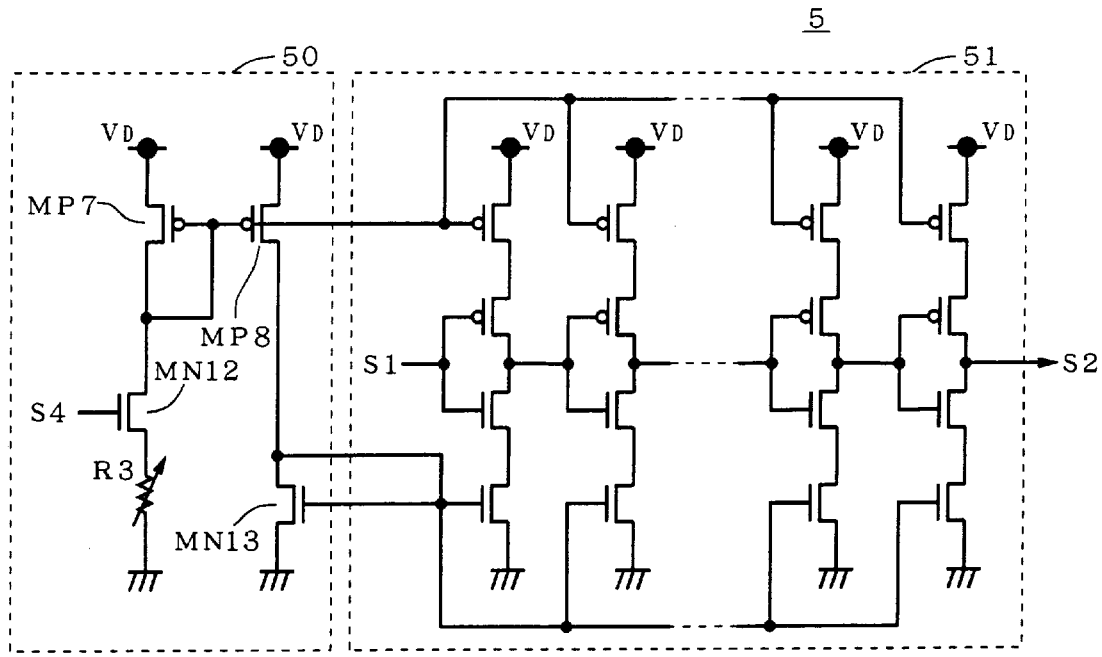
FIGS. 5 and 6 are circuit diagrams showing the configuration in accordance with the first preferred embodiment of the present invention.

FIG. 5 is a circuit diagram showing a configuration of the delay stage 5. The delay stage 5 comprises a delay adjustment circuit 50 and a delay buffer unit 51. The delay adjustment circuit 50 comprises Nch transistors MN12 and MN13, Pch transistors MP7 and MP8 and a resistor R3. The source of the transistor MN12 is grounded through the resistor R3, and the drain thereof is connected to the drain and gate of the transistor MP7. The sources of the transistors MP7 and MP8 are each supplied with the power-supply potential $V_D$ and the drain of the transistor MP8 is connected to the gate and drain of the transistor MN13. The source of the transistor MN13 is grounded.

The delay buffer unit 51 has a configuration where a plurality of inverters (referred to as "delay inverters" in the present invention) are connected in series to one another each of which has Pch transistors supplying a current to a high-potential side and Nch transistors drawing a current from a low-potential side. The clock S1 to be delayed is applied to the first-stage delay inverter. Since the transistors specifying the current to be supplied for the delay inverters and the transistor MP8 or MN13 constituting a current mirror circuit, the amount of delay of each delay inverter depends on the current flowing in the transistor MN12. The gate of the transistor MN12 is supplied with the delay adjustment signal S4 by which the amount of delay of the delay stage 5 is controlled on the whole. It is natural that the current flowing in the transistor MN12 can be controlled by variation of the resistance value of the resistor R3.

Figure 6:
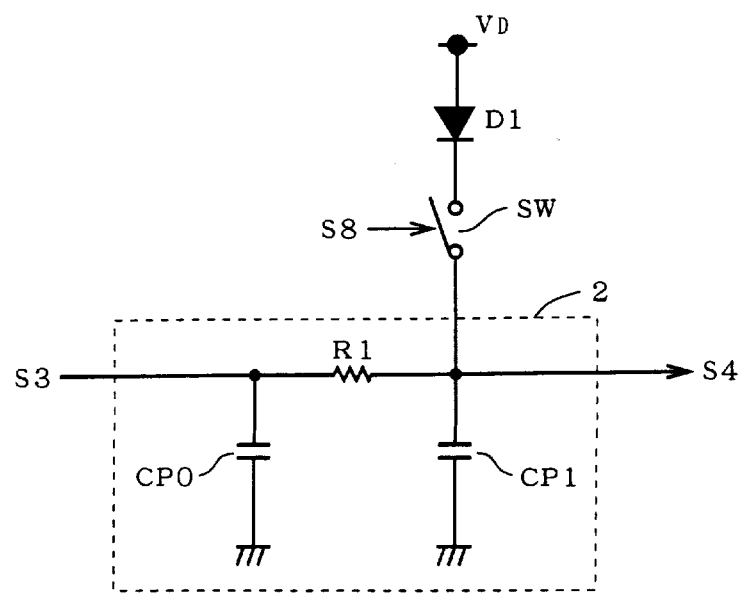

FIG. 6 is a circuit diagram illustrating a configuration of the low-pass filter 2. The first end (the left end) of a resister R1 is connected to one of the ends of a capacitor CP0 and the second end (the right end) is connected to one of the ends of a capacitor CP1. The respective other ends of the capacitors CP0 and CP1 are grounded in common. The UP/DOWN signal S3 is applied to the first end of the resistor R1. The capacitance value of the capacitor CP0 is set much smaller than that of the capacitor CP1.

Neglecting the capacitor CP0 for simple discussion, the flow-in/flow-out of the current $I_1$ to/from the low-pass filter 2 as the UP/DOWN signal S3 is mainly integrated in the resistor R1 and the capacitor CP1 into an almost DC voltage as the delay adjustment signal S4.

The capacitor CP0 serves to diminish the variation of the delay adjustment signal S4 clue to the continuous flow-in/flow-out of the current $I_1$ to/from the low-pass filter 2. Qualitatively, the high-frequency component (jitter) of the current $I_1$ is suppressed by time constant depending on the capacitor CP0 and the resistor R1 to control the variation of the voltage given to the gate of the transistor MN12 in the delay adjustment circuit 50. In this case, the time constant little depends on the capacitance value of the capacitor CP1 since the capacitance value of the capacitor CP0 is much smaller than that of the capacitor CP1. It is obvious, however, that the capacitor CP0 is not indispensable for the present invention.

Further, a function may be additionally provided to set the potential of the capacitor CP1 at the power-supply potential $V_D$ for the second end of the resistor R1 based on a reset signal S8. To achieve the above function, specifically, it is necessary to provide a protection diode D1 for a case where the capacitor CP1 is charged up to more than the power-supply potential $V_D$ and a switch SW which turns on based on the reset signal S8 in series between a potential point supplying the power-potential $V_D$ and the second end of the resistor R1. By adding this function, it is possible to start the operation with such a condition as the capacitor CP1 is charged by inputting the reset signal S8 in an initial state to carry the maximum current in the transistor MN12 and surely minimize the amount of delay of the delay stage 5.

Thus, since the 90-degree phase shifter of the first preferred embodiment uses the DLL circuit 201 instead of the PLL circuit 120, it can avoid integration of errors if exist between the oscillation frequency of the VCO circuit 122 and the frequency of the clock S1. The DLL circuit 201 simply compares the clock S1 with the clock S2 obtained by delaying the clock S1, thereby producing an advantage of excellent stability without integration of these errors.

The EXOR unit 13 in the 90-degree phase detection circuit 101 used as the 90-degree phase shifter can suppress the phase offset due to the difference of input loads that the prior-art EXOR circuit 10a would invite with less transistors in number than those of the EXOR circuit 10b having the compound gate, not enlarging the circuit scale. The current control unit 14 in the 90-degree phase detection circuit 101 is smaller in circuit scale than the charging pump circuit 11 in the 90-degree phase detection circuit 100, or slightly larger. In the end, the constitution of the first preferred embodiment using the 90-degree phase detection circuit 101 in the DLL circuit as the 90-degree phase shifter instead of the 90-degree phase detection circuit 100 can suppress the phase offset without enlargement in circuit scale.

Figure 7:
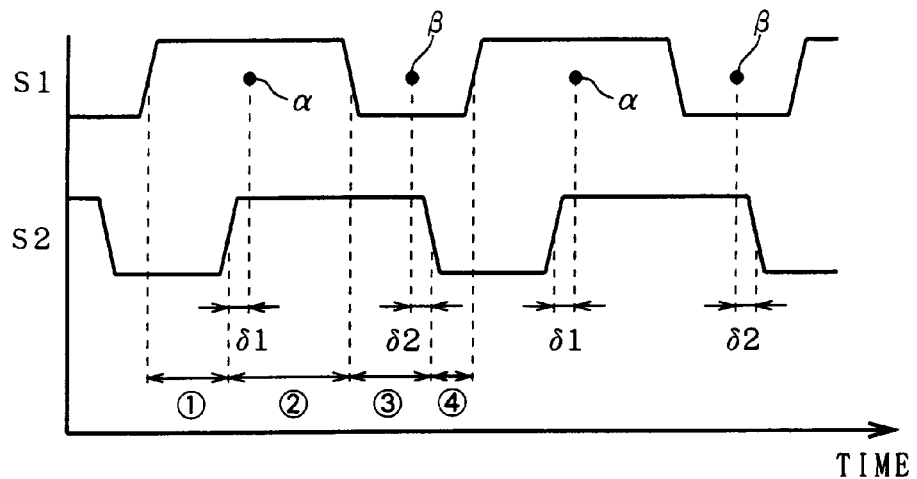
FIGS. 7 and 8 are timing charts showing the operation in accordance with the first preferred embodiment of the present invention.
Figure 8:
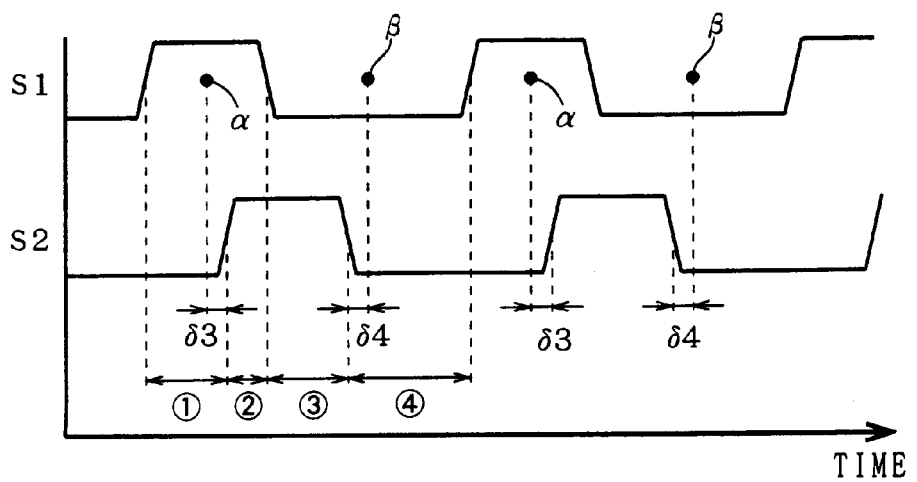

FIG. 7 is a timing chart showing a change of the clock S2 in a case where the period for the clock S1 to be "H" is longer than the period of "L" and FIG. 8 is a timing chart showing a change of the clock S2 in a case where the period for the clock S1 to be "H" is shorter than the period of "L". In these figures, the clocks S1 and S2 are ("H", "L"), ("H", "H"), ("L", "H") and ("L", "L") during periods ① to ④, respectively.

Since the delay adjustment signal S4 is controlled based on the exclusive OR of the clocks S1 and S2, the clock S2 is locked for the clock S1 when the total of the periods ① and ③ are equal to that of the periods ② and ④. Further, since the change of the clock S2 lags behind that of the clock S1 by 90 degrees, the periods ① and ③ each keep a period corresponding to 90-degree phase and the periods ② and ④ keep in total a period corresponding to 180-degree phase.

When the period for the clock S1 to be "H" is longer than the period of "L", the rising edge of the clock S2 leads ahead of the center α of the period for the clock S1 to be "H" by δ1 and the falling edge lags behind the center β of the period of "L" by δ2. When the period for the clock S1 to be "H" is shorter than the period of "L", the rising edge of the clock S2 lags behind the center α of the period for the clock S1 to be "H" by δ3 and the falling edge leads ahead of the center β of the period of "L" by δ4. In other words, even if the duty of the clock S1 is not 50%, the clock S2 changes with the same duty as the clock S1, keeping the delay of 90 degrees.

The Second Preferred Embodiment

Figure 9:
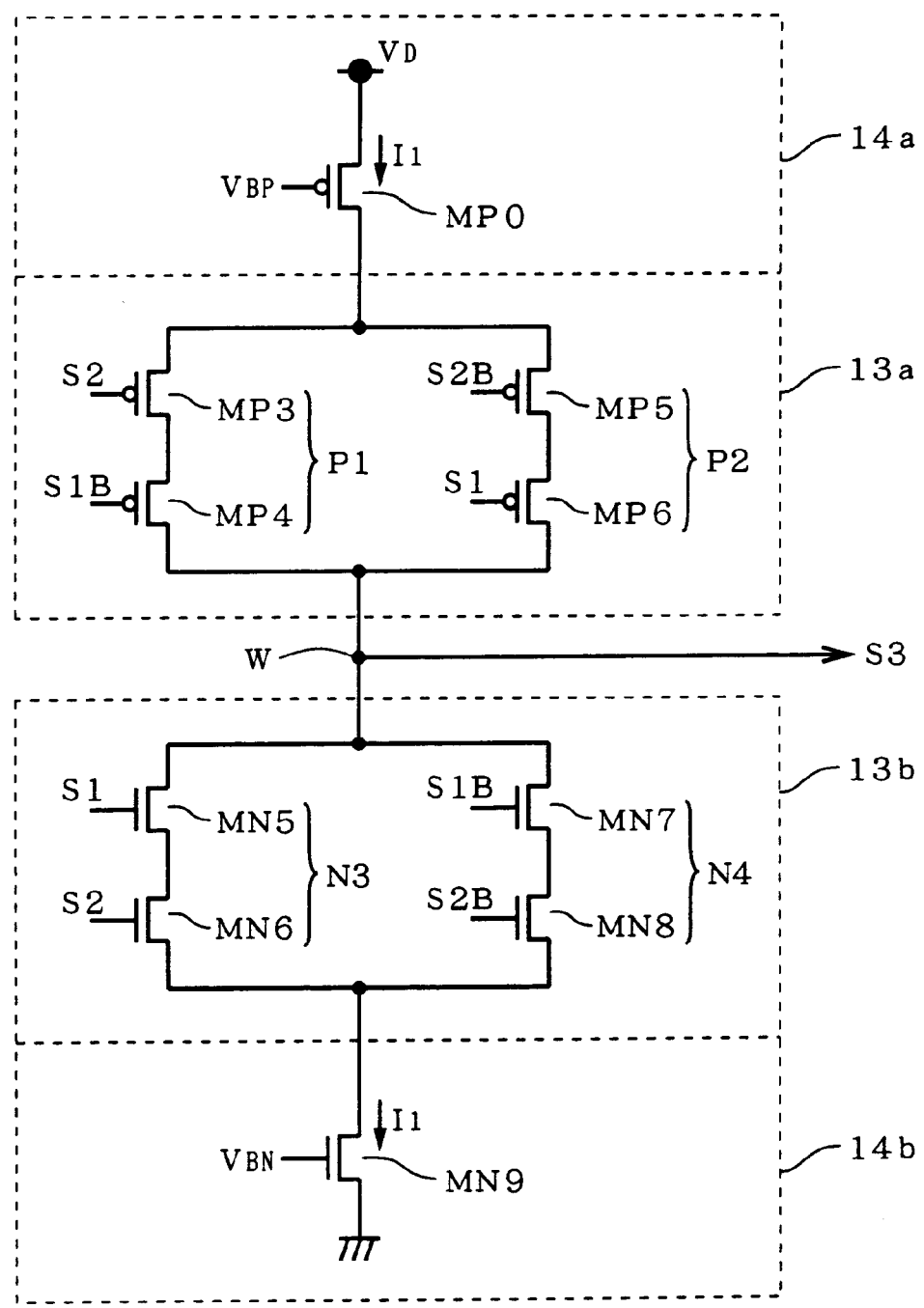
FIG. 9 is a circuit diagram showing a configuration in accordance with a second preferred embodiment of the present invention.

FIG. 9 is a circuit diagram showing a configuration of a 90-degree phase detection circuit 102 in a 90-degree phase shifter in accordance with the second preferred embodiment of the present invention, which is used instead of the 90-degree phase detection circuit 100 of FIG. 18.

The 90-degree phase detection circuit 102 comprises EXOR units 13a and 13b and current control units 14a and 14b. The EXOR unit 13a becomes conducting only when the exclusive OR of the clocks S1 and S2 is "H" and the EXOR unit 13b becomes conducting only when the exclusive OR of the clocks S1 and S2 is "L".

Specifically, the EXOR unit 13a comprises Pch transistors MP3 to MP6 having the same characteristics. The sources of the transistors MP3 and MP5 are connected in common to the drain of a transistor MP0, and the drains of the transistors MP3 and MP5 are connected to the sources of the transistors MP4 and MP6, respectively. The drains of the transistors MP4 and MP6 are connected. In short, a serial connection P1 consisting of the transistors MP3 and MP4 and a serial connection P2 consisting of the transistors MP5 and MP6 are connected in parallel to each other, constituting the EXOR unit 13a. The serial connections N3 and N4 of the first preferred embodiment are connected in parallel to each other, constituting the EXOR unit 13b.

The clock S1 is applied in common to the gates of the transistors MP6 and MN5 and its inverted signal S1B is applied to the gates of the transistors MP4 and MN7. The clock S2 is applied to the gates of the transistors MP3 and MN6 and its inverted signal S2B is applied to the gates of the transistors MP5 and MN8.

The current control unit 14a is made of the Pch transistor MP0, and its source and gate are supplied with the power-supply potential $V_D$ and the bias potential $V_{BP}$, respectively, and its drain is connected to the sources of the transistors MP3 and MP5. The current control unit 14b is made of the Nch transistor MN9, and its source is grounded, its gate is supplied with the bias potential $V_{BN}$ and its drain is connected to the sources of the transistors MN6 and MN8.

The UP/DOWN signal S3 is obtained from a node W to which the drains of the transistors MP4, MP6, MN5 and MN7 are connected.

By giving the bias potentials $V_{BP}$ and $V_{BN}$ so that both the transistors MP0 and MN9 may produce the current $I_1$, the UP/DOWN signal S3 is outputted in a form of current to the low-pass filter 2 like the first preferred embodiment.

In the operation, when the clocks S1 and S2 take the same logic value, the EXOR units 13a and 13b turn off and on, respectively. Therefore, the current $I_1$ flows in as the UP/DOWN signal S3 from the low-pass filter 2. On the other hand, when the clocks S1 and S2 take different logic values, the EXOR units 13a and 13b turn on and off, respectively. Therefore, the current $I_1$ flows out as the UP/DOWN signal S3 to the low-pass filter 2.

The 90-degree phase shifter using the 90-degree phase detection circuit 102 of the second preferred embodiment produces an effect of further reducing the circuit scale, as well as the effect of the first preferred embodiment using the 90-degree phase detection circuit 101, since a CMOS configuration is adopted where only Pch transistors are used on the higher-potential side relative to a point from which the UP/DOWN signal S3 is drawn and only Nch transistors are used on the lower-potential side. Moreover, since the 90-degree phase detection circuit 102 little produces the current that the 90-degree phase detection circuit 101 always carries between the power-supply potential $V_D$ and the ground, it can additionally produce an effect of reduction in power consumption.

The Third Preferred Embodiment

Figure 10:
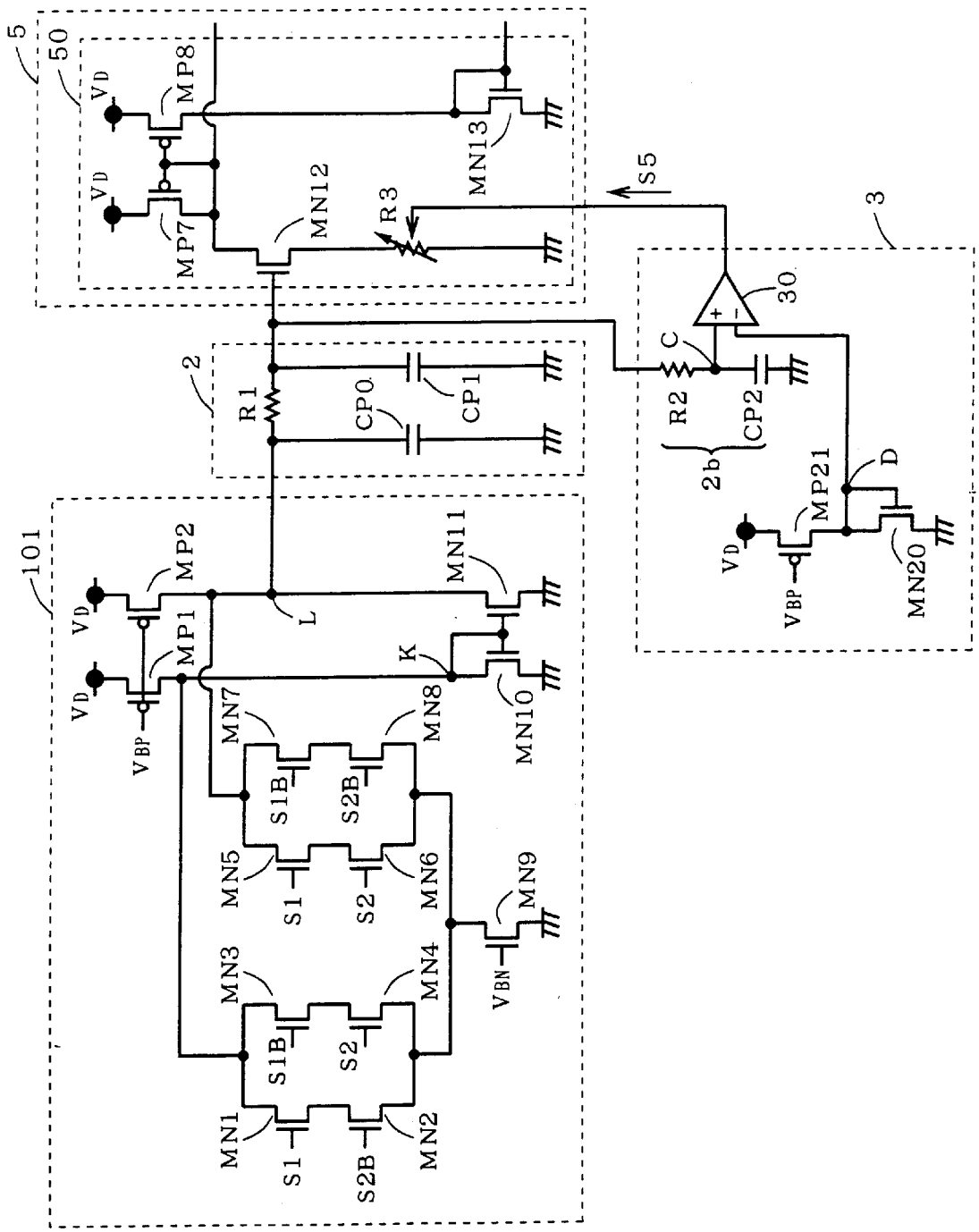
FIGS. 10 and 11 are circuit diagrams showing a configuration in accordance with a third preferred embodiment of the present invention.

FIG. 10 is a circuit diagram showing a main part of a 90-degree phase shifter in accordance with the third preferred embodiment of the present invention. This preferred embodiment has a configuration where an offset cancel circuit 3 is added to the configuration of the first preferred embodiment.

The offset cancel circuit 3 generates an offset cancel signal S5 based on the delay adjustment signal S4 given from the low-pass filter 2. The offset cancel signal S5 adjusts the resistance value of the resistor R3 included in the delay adjustment circuit 50 of the delay stage 5.

In the 90-degree phase detection circuit 101, when the clock S2 is locked (balanced) in phase for the clock S1, the potential of the node K to which the drains of the transistors MP1, MN1, MN3 and MN10 are connected in common and that of the node L to which the drains of the transistors MP2, MN5, MN7 and MN11 are connected in common should be almost equal.

When there is slight variation in temperature and so on, however, the transistors MN10 and MN11 produce slightly-different currents since the drains thereof have different potentials. As a result, the current mirror circuit constituted of the transistors MN10 and MN11 has a lower mirror efficiency and in some cases, the amount of delay of the delay stage 5 is brought into balance with some phase offset relative to 90 degrees. Then, being in balance, the potentials at the nodes K and L neither rise nor fall and the 90-degree phase detection circuit 101 continues operating with the phase offset kept.

The offset cancel circuit 3 is provided to make a further exact delay of 90 degrees in phase. In the offset cancel circuit 3, one of the end of a resistor R2 receives the delay adjustment signal S4 and the other end is connected to one of the ends of a capacitor CP2 and a positive input end of a differential amplifier 30 at a node C. The other end of the capacitor CP2 is grounded. A negative input end of the differential amplifier 30 is connected in common to the drains of transistors MP21 and MN20 at a node D, and an output end thereof outputs the offset cancel signal S5. The source of the transistor MP21 is supplied with the power-supply potential $V_D$ and the source of the transistor MN20 is grounded. The gate and drain of the transistor MN20 are connected to each other and the gate of the transistor MP21 is supplied with the bias potential $V_{BP}$. The transistors MP21 and MN20 have the same characteristics as the transistors MP1 and MN10, respectively, and the transistors MP21 and MN20 are provided as dummies of the transistors MP1 and MN10 of the 90-degree phase detection circuit 101, respectively.

The differential amplifier 30 indirectly receives the potential of the node L at the node C and compares the received potential with the potential of the node D. Since the potential of the node D is considered equal to that of the node K, the offset cancel signal S5 can adjust the resistance value of the resister R3 so as to cancel the potential difference between the nodes K and L.

The potential of the node L is transferred to the node C through two low-pass filters, i.e., the low-pass filter 2 and a low-pass filter 2b constituted of the resister R2 and the capacitor CP2. The low-pass filter 2 averages the amount of charges flowing in the node L with the capacitor CP1, thereby generating a DC voltage signal as the delay adjustment signal S4. After controlling the delay stage 5 with the delay adjustment signal S4, there is a next balance followed by the variation of the potential of the node L. By setting the capacitance value of the capacitor CP2 larger than that of the capacitor CP1 to make the time constant of the low-pass filter 2 larger than that of the low-pass filter 2b, it is possible to slow the change of the potential of the node C outputted from the low-pass filter 2b as compared with that of the potential of the node L inputted to the low-pass filter 2. With this configuration, the differential amplifier 30 slowly controls the resistance value of the resistor R3 after the delay is once controlled, almost keeping the balance, to make the gate potential of the transistor MN12 (i.e., the potential of the output end of the low-pass filter 2) equal to the potential of the node D.

Furthermore, since the transistors MP21 and MN20 work as dummies of the transistors MP1 and MN10, someone may think that two low-pass filters are needed also for the node D as the signal from the node L is transferred to the node C through the two low-pass filters. In a balanced condition, however, no current flows in the gate of the transistor MN12 on the average by virtue of the function of the low-pass filter 2 since the current flowing in the low-pass filter 2 from the node L and the current flowing out from the low-pass filter 2 are equal. In other words, there is no case where a voltage drop due to current flow is developed across the resistor R2 connected to the node C. On the other hand, no current flows in the node D since it is connected to the negative input end of the differential amplifier 30 which has high impedance. Therefore, there is no need for providing two low-pass filters for the node D.

Figure 11:
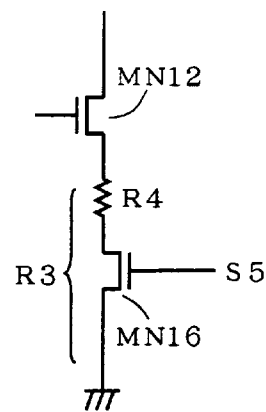

FIG. 11 is a circuit diagram illustrating a configuration of the resistor R3. The resistor R3 is constituted of a fixed resistor R4 and an Nch transistor MN16 which are connected in series. Supplying the gate potential of the transistor MN16 with the offset cancel signal S5 changes an ON-resistance of the transistor MN16.

Thus, since the potential difference between the nodes K and L is indirectly detected by using the nodes C and D and a feed-back is made, based on the potential difference, to control the current that the transistor MN12 produces, the third preferred embodiment can make the potential of the node L almost equivalent to that of the node K in the locked condition, thereby solving the problem of phase offset.

The Fourth Preferred Embodiment

Figure 12:
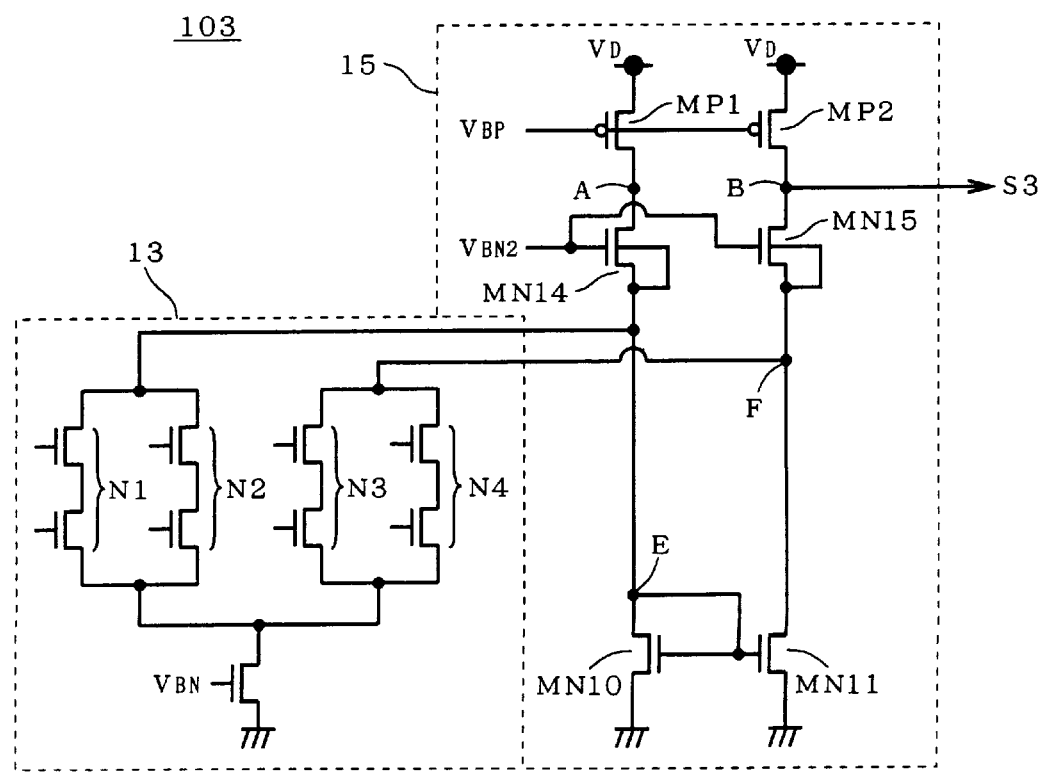
FIG. 12 is a circuit diagram showing a configuration in accordance with a fourth preferred embodiment of the present invention.

FIG. 12 is a circuit diagram showing a configuration of a 90-degree phase detection circuit 103 used instead of the 90-degree phase detection circuit 100 of FIG. 18 in a 90-degree phase shifter in accordance with the fourth preferred embodiment of the present invention. The 90-degree phase detection circuit 103 has a constitution where a current control unit 15 is used instead of the current control unit 14 in the 90-degree phase detection circuit 101 of the first preferred embodiment.

The current control unit 15 has a configuration where two Nch transistors MN14 and MN15 are additionally provided in the current control unit 14. Specifically, the drain of the transistor MN10 and the source and back-gate of the transistor MN14 are connected at a node E and the drain of the transistor MP1 and the drain of the transistor MN14 are connected at a node A. Further, the drain of the transistor MN11 and the source and back-gate of the transistor MN15 are connected at a node F and the drain of the transistor MP2 and the drain of the transistor MN15 are connected at a node B. The nodes E and F are connected to the EXOR unit 13. In short, the transistors MP1 and MN14 are used as one power-supply unit and the transistors MP2 and MN15 are used as another power-supply unit.

In this configuration, by supplying the gates of the transistors MN14 and MN15 in common with a bias potential $V_{BN2}$, the potential difference between the nodes E and F can be suppressed.

It is assumed that respective potentials of the nodes A, B, E and F are $V_a$, $V_b$, $V_e$ and $V_f$. When the circuit of FIG. 12 operates, a current always flows through one of the four series connections N1 to N4 constituting the EXOR unit 13 towards the ground, and momentarily the nodes E and F have different current values. On the average, however, the currents of equivalent values flow from the nodes E and F towards the EXOR unit 13 in a balanced condition. Further, momentarily viewed from the node B, the current flows into or out from the low-pass filter 2, but on the average, no current flows in the low-pass filter 2.

Then, the same current flows in the transistors MN14 and MN15 on the average. This current is assumed to be $I_0'$. Therefore, the following Equations (1) and (2) can be held (see, e.g., "Analysis and Design of Analog Integrated Circuits (second edition)" by Paul R. Gray & Robert G. Meyer, John Wiley & Sons Inc., p. 66)

$$I_0' = \frac{k}{2}\frac{W}{L}(V_{BN2} - V_e - V_{TH})^2(1 + \lambda(V_a - V_e)) \quad (1)$$

$$I_0' = \frac{k}{2}\frac{W}{L}(V_{BN2} - V_f - V_{TH})^2(1 + \lambda(V_b - V_f)) \quad (2)$$

where k is a product of gate capacitance and mobility of charges, W and L are gate width and gate length of a transistor, respectively, $V_{TH}$ is a threshold voltage and $\lambda$ is a short channel effect. Since the respective source and back-gate potentials of the transistors MN14 and MN15 are equal, the difference in threshold value due to the body effect of the transistors MN14 and MN15 is not cared.

Assuming that $V_f = V_e + \delta V_{ef}$, $V_b = V_a + \delta V_{ab}$, Equations (1) and (2) can be expressed as follows:

$$I_0' = \frac{k}{2}\frac{W}{L}(V_{BN2} - V_e - V_{TH})^2(1 + \lambda(V_a - V_e)) \quad (3)$$

$$I_0' = \frac{k}{2}\frac{W}{L}(V_{BN2} - V_e - V_{TH} - \delta V_{ef})^2(1 + \lambda(V_a - V_e - \delta V_{ef} + \delta V_{ab})) \quad (4)$$

By taking the difference between Equations (3) and (4) and not caring the product of $\delta V_{ab}$ and $\delta V_{ef}$ or square term thereof, the following equation is obtained:

$$\frac{\delta V_{ef}}{\delta V_{ab}} = \frac{\lambda(V_{BN2} - V_e - V_{TH})}{2(1 + \lambda(V_a - V_e)) + \lambda(V_{BN2} - V_e - V_{TH})} \quad (5)$$

The short channel effect $\lambda$ usually has 0.03 to 0.005 $V^{-1}$ according to the above document, and therefore the value of Equation (5) is not more than 1/100.

Thus, there is little potential difference between the nodes E and F which are the drains of the transistors MN10 and MN11 constituting a current mirror though the potential of the node B outputting the UP/DOWN signal S3 is different from the potential of the node A which is paired with the node B, in the balanced conduction of the 90-degree phase detection circuit 103. Therefore, it is possible to carry an equivalent current in the transistors MN10 and MN11 and suppress the offset of the 90-degree phase detection circuit 103.

The Fifth Preferred Embodiment

FIG. 13 is a circuit diagram showing a configuration of a 90-degree phase detection circuit 104 used instead of the 90-degree phase detection circuit 100 of FIG. 18 in a 90-degree phase shifter in accordance with the fifth preferred embodiment of the present invention. The 90-degree phase detection circuit 104 has a constitution where a current control unit 16 is used instead of the current control unit 15 of the 90-degree phase detection circuit 103 of the fourth preferred embodiment.

The current control unit 16 has a configuration where two Pch transistors MP9 and MP10 are additionally provided in the current control unit 15. Specifically, the drain of the transistor MP1 and the source and back-gate of the transistor MP9 are connected at a node G and the drain of the transistor MP9 and the drain of the transistor MN14 are connected at the node A. Further, the drain of the transistor MP2 and the source and back-gate of the transistor MP10 are connected at a node H and the drain of the transistor MP10 and the drain of the transistor MN15 are connected at the node B. In short, the transistors MP1, MP9 and MN14 are used as one power-supply unit and the transistors MP2, MP10 and MN15 are used as another power-supply unit.

In this configuration, the gates of the transistors MP9 and MP10 are supplied in common with a bias potential $V_{BP2}$. In the current control unit 15 of the fourth preferred embodiment, if there is a potential difference between the nodes A and B, a slight difference between currents flowing in the transistors MP1 and MP2 is caused by the difference of the drain voltages. The fifth preferred embodiment, however, can suppress the potential difference between the nodes G and H in the current control unit 16 by inserting the transistors MP9 and MP10 based on the same principle as the fourth preferred embodiment, and can therefore achieve a higher-precision offset cancel effect.

While the invention has been shown and described in detail, the foregoing description is in all aspects illustrative and not restrictive. It is therefore understood that numerous modifications and variations can be devised without departing from the scope of the invention.

We claim:

1. A 90-degree phase shifter, comprising:
    a first current control circuit comprising
    a first node and a second node,
    a first current source for supplying said first node with a first current,
    a second current source for supplying said second node with a second current, and
    a current mirror circuit including a first path for drawing a third current from said first node and a second path for drawing a fourth current from said second node; and
    a second current control circuit comprising
    a first switch circuit receiving first and second signals, connected to said first node, and being rendered conductive in response to said first and second signals to draw a fifth current from said first node, said first switch circuit being configured to be conductive when an exclusive OR logic value of said first and second signals is a first logic value, and
    a second switch circuit receiving first and second signals, connected to said second node, and being rendered conductive in response to said first and second signals to draw a sixth current from said second node, said second switch circuit being configured to be conductive when an exclusive OR logic value of said first and second signals is a second logic value different from said first logic value, a first low-pass filter connected to said second node; and a delay unit for delaying said first signal by an amount of delay controlled by an output potential of said first low-pass filter to output said second signal.

2. The 90-degree phase shifter of claim 1, wherein said second current control circuit comprises a third current source for producing a current, said first switch circuit including:

a first serial connection and a second serial connection connected in parallel between said third current source and said first node, said first serial connection includes a first switch and a second switch connected in series, said first switch becoming conducted when said first signal takes said first logic value and said second switch becoming conducted when said second signal takes said second logic value, and said second serial connection includes a first switch and a second switch connected in series, said first switch becoming conducted when said first signal takes said second logic value and said second switch becoming conducted when said second signal takes said first logic value.

3. The 90-degree phase shifter of claim 2, wherein said second switch unit comprises:

a third serial connection and a fourth serial connection connected in parallel between said third current source and said second node, said third serial connection includes a first switch and a second switch connected in series, said first switch becoming conducted when said first signal takes said first logic value and said second switch becoming conducted when said second signal takes said first logic value, and said fourth serial connection includes a first switch and a second switch connected in series, said first switch becoming conducted when said first signal takes said second logic value and said second switch becoming conducted when said second signal takes said second logic value.

4. The 90-degree phase shifter of claim 1, wherein said current mirror circuit further includes a first transistor having a gate and a drain which are connected in common to said first node and a source, for producing a current flowing in said first path; and a second transistor having a gate connected to said gate of said first transistor, a source connected to source of said first transistor and a drain connected to said second node, for producing a current flowing in said second path.

5. The 90-degree phase shifter of claim 1, wherein said first low-pass filter comprises:

a resistor having a first end connected to said second node and a second end for obtaining said output potential of said first low-pass filter;

a first capacitor having a first end connected to said first end of said resistor and a second end; and a second capacitor having a first end connected to said second end of said resistor and a second end connected to said second end of said first capacitor, said second capacitor having a capacitance value larger than that of said first capacitor.

6. The 90-degree phase shifter of claim 5, wherein said first low-pass filter further comprises a power supply mechanism for bringing said second capacitor into a charged condition as initial condition.

7. The 90-degree phase shifter of claim 6, wherein said power supply mechanism comprises a switch having a first end connected to said first end of said second capacitor and a second end which becomes conducting with said first end of said switch by a reset signal; and a diode having a cathode connected to said second end of said switch and an anode to which a potential higher than that of said second end of said second capacitor is applied.

8. The 90-degree phase shifter of claim 1, wherein said delay unit has a delay buffer unit consisting of a plurality of delay inverters connected in series and including a first stage receiving said first signal and a last stage for outputting said second signal;

a delay adjustment circuit including a transistor having a gate to which said output potential of said first low-pass filter is applied, for controlling a current to be supplied for said plurality of delay inverters based on a current flowing in said transistor.

9. The 90-degree phase shifter of claim 1 further comprising an offset cancel circuit, said offset cancel circuit having:

a differential amplifier including a positive input end receiving said output potential of said first low-pass filter as an input signal, a negative input end and an output end for outputting a control signal which controls said amount of delay together with said output potential of said first low-pass filter; and a dummy unit achieving a connection equivalent to said first current source and said first path of said current mirror circuit, being connected to said negative input end of said differential amplifier and including a dummy node corresponding to said first node.

10. The 90-degree phase shifter of claim 9, wherein said delay unit comprises:

a delay buffer unit consisting of a plurality of delay inverters connected in series which include a first stage receiving said first signal and a last stage for outputting said second signal; and a delay adjustment circuit including a transistor having a gate to which said output potential of said first low-pass filter is applied and a variable resister, for controlling a current to be supplied for said plurality of delay inverters based on a current flowing in said transistor.

11. The 90-degree phase shifter of claim 9, wherein said offset cancel circuit further has a second low-pass filter provided between said first low-pass filter and said positive input end of said differential amplifier and having a time constant larger than that of said first low-pass filter.

12. The 90-degree phase shifter of claim 1, wherein said first current source comprises a first transistor having a source and a back-gate which are connected in common to said first node, a gate to which a first bias is applied and a drain; and a second transistor having a drain connected to said drain of said first transistor, a gate to which a second bias is applied and a source, and said second current source comprises a first transistor having a source and a back-gate which are connected in common to said second node, a gate to which said first bias is applied and a drain; and a second transistor having a source connected to said source of said second transistor of said first current source, a drain connected to said drain of said first transistor of said second current source and a gate to which said second bias is applied.

13. The 90-degree phase shifter of claim 12, wherein said first low-pass filter is coupled to said second node through said first transistor of said second current source.

14. The 90-degree phase shifter of claim 12, wherein said first current source further comprises a third transistor having a drain connected to said drain of said first transistor of said first current source, a source and a back-gate connected in common to said drain of said second transistor of said first current source and a gate to which a third bias is applied, and said second current source further comprises a third transistor having a drain connected to said drain of said first transistor of said second current source, a source and a back-gate connected in common to said drain of said second transistor of said second current source and a gate to which a third bias is applied.

15. The 90-degree phase shifter of claim 14, wherein said first low-pass filter is coupled to said second node through said first transistor of said second current source.

16. A 90-degree phase shifter, comprising:

a first current source for providing a first current;

a second current source for providing a second current;

an output node;

a first switch circuit receiving first and second signals, connected to said first current source and said output node, said first switch circuit being configured to be rendered conductive when an exclusive OR logic value of said first and second signals takes a first logic value; and a second switch circuit receiving first and second signals, connected to said second current source and said output node, said second switch circuit being configured to be rendered conductive when an exclusive OR logic value of said first and second signals takes a second logic value different from said first logic value;

a low-pass filter connected to said output node; and a delay unit for delaying said first signal by an amount of delay controlled by an output potential of said low-pass filter to output said second signal.

17. The 90-degree phase shifter of claim 16 wherein said first switch circuit comprises a first serial connection and a second serial connection which are connected in parallel to each other and to said first current source and said output node, and said second switch circuit comprises a third serial connection and a fourth serial connection which are connected in parallel to each other and to said second current source and said output node, wherein said first serial connection includes a first switch and a second switch connected in series, said first switch being rendered conductive in response to said first signal, said second switch being rendered conductive in response to said second signal, said second serial connection includes a third switch and a fourth switch connected in series, said third switch being rendered conductive in response to said first signal, said fourth switch being rendered conductive in response to said second signal, said third serial connection includes a fifth switch and a sixth switch connected in series, said fifth switch being rendered conductive in response to said first signal, said sixth switch being rendered conductive in response to said second signal, said fourth serial connection includes a seventh switch and an eighth switch connected in series, said seventh switch being rendered conductive in response to said first signal, said eighth switch being rendered conductive in response to said second signal.

18. The 90-degree phase shifter of claim 17, wherein said first to fourth switches each include a p-type MOS transistor, and said fifth to eighth switches each include an n-type MOS transistor.

19. A phase detection circuit comprising:

a first node;

a second node for outputting a detection signal;

a first current source for providing the first node with a first current;

a second current source for providing the second node with a second current;

a current mirror circuit having a first path connected to the first node and a second path connected to the second node;

a power supply terminal to which a voltage is applied, and a current control circuit receiving first to fourth signals, for drawing a current from each of said first and second nodes, said current control circuit including a first path and a second path connected in parallel between said first node and said power supply terminal, and a third path and a fourth path connected in parallel between said second node and said power supply terminal, said first path including first and second switches connected in series and being rendered conductive in response to the first and second signals, respectively, said second path including third and fourth switches connected in series and being rendered conductive in response to the third and fourth signals, respectively, said third path including fifth and sixth switches connected in series and being rendered conductive in response to the first and fourth signals, respectively, said fourth path including seventh and eighth switches connected in series and being rendered conductive in response to the second and third signals, respectively, the first and third signals having logical values opposite to each other, and the second and fourth signals having logical values opposite to each other.

20. The phase detection circuit of claim 19, further comprising a transistor connected between said power supply terminal and each of said first to fourth paths.

* * * * *